(12) United States Patent
Kim et al.

(10) Patent No.: US 10,127,973 B2
(45) Date of Patent: Nov. 13, 2018

(54) TRAINING CONTROLLER, AND SEMICONDUCTOR DEVICE AND SYSTEM INCLUDING THE SAME

(71) Applicant: SK hynix Inc., Icheon-si Gyeonggi-do (KR)

(72) Inventors: Seo Jun Kim, Icheon-si (KR); Kyu Bong Kong, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/488,900

(22) Filed: Apr. 17, 2017

(65) Prior Publication Data

US 2018/0130516 A1 May 10, 2018

(30) Foreign Application Priority Data

Nov. 7, 2016 (KR) .......................... 10-2016-0147307

(51) Int. Cl.
| | | |
|---|---|---|
| *G11C 7/10* | (2006.01) | |
| *G11C 11/4096* | (2006.01) | |
| *G11C 11/4076* | (2006.01) | |
| *G11C 11/4093* | (2006.01) | |
| *G11C 29/00* | (2006.01) | |
| *G11C 29/02* | (2006.01) | |

(52) U.S. Cl.
CPC ........ *G11C 11/4096* (2013.01); *G11C 7/1087* (2013.01); *G11C 7/1093* (2013.01); *G11C 11/4076* (2013.01); *G11C 11/4093* (2013.01); *G11C 29/00* (2013.01); *G11C 29/022* (2013.01); *G11C 29/023* (2013.01); *G11C 29/028* (2013.01); *G11C 2207/22* (2013.01); *G11C 2207/2254* (2013.01)

(58) Field of Classification Search
CPC .................... G11C 2207/22; G11C 2207/2254
USPC .......................................................... 365/193
See application file for complete search history.

(56) References Cited

U.S. PATENT DOCUMENTS

| | | | |
|---|---|---|---|
| 8,503,254 B2 | 8/2013 | Park | |
| 8,711,643 B2 * | 4/2014 | Kato | G11C 7/02 365/189.05 |
| 8,982,650 B2 * | 3/2015 | Nishiwaki | G11C 7/1066 365/189.05 |
| 9,047,927 B2 * | 6/2015 | Takai | G11C 7/04 |
| 9,287,855 B2 | 3/2016 | Ku | |
| 9,514,420 B2 * | 12/2016 | Bose | G06N 99/005 |
| 9,646,675 B1 * | 5/2017 | Lee | G11C 11/4093 |
| 9,659,608 B2 * | 5/2017 | Jung | G11C 7/10 |

* cited by examiner

*Primary Examiner* — Son Mai
(74) *Attorney, Agent, or Firm* — William Park & Associates Ltd.

(57) ABSTRACT

A training controller, semiconductor device and a system including the same are disclosed, which relates to technology for training a phase of data. The training controller may include a read training circuit configured to control a read training operation based on a read signal and a control signal. The training controller may include a write training circuit configured to control a write training operation based on a write signal and a write training signal. The training controller may include a reset controller configured to generate a reset signal when a mismatch occurs in the read training operation or the write training operation.

20 Claims, 10 Drawing Sheets

TRAINING CONTROLLER, AND SEMICONDUCTOR DEVICE AND SYSTEM INCLUDING THE SAME

CROSS-REFERENCE TO RELATED APPLICATION

This application claims priority based upon Korean patent application No. 10-2016-0147307, filed on Nov. 7, 2016, the disclosure of which is hereby incorporated in its entirety by reference herein.

BACKGROUND

1. Technical Field

Embodiments of the present disclosure may generally relate to a training controller, and semiconductor device and a system including the same, and more particularly to a technology for training a phase.

2. Related Art

With increasing integration of semiconductor memory devices, operation speeds of the semiconductor memory devices have also been continuously improved. In order to increase operation speeds of semiconductor memory devices, synchronous memory devices capable of operating by synchronizing with an external clock of a memory chip have recently been proposed.

A double data rate (DDR) synchronous memory device capable of processing two pieces of data during one clock period has been proposed. Two contiguous pieces of data are input and output through respective data input and output (input/output) (I/O) pins of the DDR synchronous memory device, such that the two contiguous pieces of data are synchronized with a rising edge and a falling edge of an external input clock. Therefore, although a clock frequency of the DDR synchronous memory device is not increased, the DDR synchronous memory device may have a bandwidth that is at least two times larger than that of the SDR synchronous memory device, such that the DDR synchronous memory device can operate at a higher speed than the SDR synchronous memory device.

A semiconductor device consists of a data training circuit configured to adjust setup and hold (setup/hold) times upon receiving predetermined input data. When reading data from or writing data in a semiconductor memory device (e.g., DRAM), data training is performed to adjust a skew between data pieces. Here, data training may refer to a task for adjusting and controlling the setup time and the hold time between data and a clock signal (i.e., a data strobe signal).

However, although the setup/hold times are correctly adjusted for each data received from a data pin, when the semiconductor device operates at a high speed or a skew occurs in each data channel, the setup/hold times of data may unavoidably deviate from an appropriate range.

That is, due to physical delay factors generated in the clock and data transmission process, the rising edge and the falling edge of the clock may not exist in a valid window of data (DATA). In this case, the semiconductor memory device may receive incorrect data. Specifically, since a valid window (UI) of data gradually decreases and the amount of data gradually increases in a high-speed operation system, it becomes more difficult to stably transmit data.

Therefore, the latest high-speed operation specification has widely used a method for latching data at an output terminal of a data DQ buffer without using a circuit configured to control the setup time or the hold time. However, if data transferred from an external controller to a semiconductor memory device is not aligned with reminder data generated from the semiconductor memory device, training errors may occur.

SUMMARY

In accordance with an embodiment of the present disclosure, a training controller, a semiconductor device and or system may be provided. The training controller may include a read training circuit configured to control a read training operation based on a read signal and a control signal. The training controller may include a write training circuit configured to control a write training operation based on a write signal and a write training signal. The training controller may include a reset controller configured to generate a reset signal when a mismatch occurs in the read training operation or the write training operation.

DETAILED DESCRIPTION

Reference will now be made to embodiments of the present disclosure, examples of which are illustrated in the accompanying drawings. Wherever possible, the same reference numbers are used throughout the drawings to refer to the same or like portions. In the following description of the present disclosure, a description of related known configurations or functions incorporated herein may be omitted for clarity of the subject matter of the present disclosure.

Various embodiments of the present disclosure may be directed to providing a semiconductor device and a system including the same that substantially obviate one or more problems due to limitations and disadvantages of the related art.

An embodiment of the present disclosure may relate to a technology for generating a reset signal when mismatch occurs in a read training operation and a write training operation, resulting in prevention of a training error.

Figure 1:
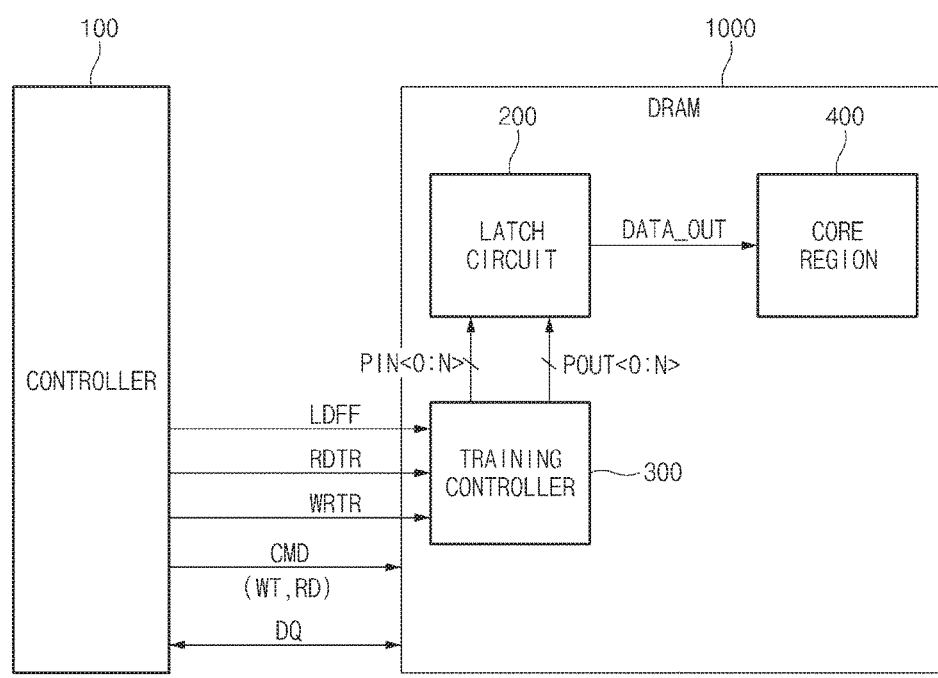
FIG. 1 is a block diagram illustrating a representation of an example of a system according to an embodiment of the present disclosure.

FIG. 1 is a block diagram illustrating a representation of an example of a system according to an embodiment of the present disclosure.

Referring to FIG. 1, the system may include a controller 100 and a semiconductor device 1000. The semiconductor device 1000 may include a latch circuit 200, a training controller 300, and a core region 400.

The controller 100 may output a control signal (LDFF), a read training signal (RDTR), and a write training signal (WRTR) for controlling the training operation of data to the semiconductor device 1000. The controller 100 may output a command signal (CMD) for controlling the semiconductor device 1000 to the semiconductor device 1000. Here, the command signal (CMD) may include a write signal (WT) for controlling the write operation of data, and a read signal (RD) for controlling the read operation of data. The controller 100 and the semiconductor device 1000 may perform an input and output (input/output) (I/O) operation of data (DQ) during the read or write operation.

The semiconductor device 1000 may store data in the core region 400. For convenience of description and better understanding of the present disclosure, the semiconductor device 1000 is composed of a dynamic random access memory (DRAM). If a data processing device (e.g., the controller 100) requests data, the semiconductor device 1000 may output data corresponding to an address received from the data requesting device, or may store data received from the data requesting device in a specific position corresponding to the address.

If an operation temperature or an operation power of the controller 100 is changed when data (DQ) is input or output between the controller 100 and the semiconductor device 1000, a phase of data (DQ) which is input or output between the controller 100 and the semiconductor device 1000 is changed.

For example, I/O data (DQ) between the controller 100 and the semiconductor device 1000 may be input or output by synchronizing with a clock signal for transmitting the data (DQ). However, the operation temperature or the operation power of the system may be changed when data (DQ) is input or output between the controller 100 and the semiconductor device 1000.

As a result, a phase between the clock signal and data (DQ) that is input or output between the controller 100 and the semiconductor device 1000 is twisted (i.e., is out of phase), such that data (DQ) having a different phase from a transmission start point may be input or output. Accordingly, it may be recognized that I/O data between the controller 100 and the semiconductor device 1000 moves one space backward or forward on the basis of a target space having a data-desired state, such that it is impossible to normally transmit data.

Therefore, the semiconductor device according to an embodiment performs the training operation of data (DQ). If input data and output data generated during the training operation have different reminder values, the semiconductor device may reset the training data. The semiconductor device 1000 may normally transmit data through the above-mentioned data training operation.

That is, the semiconductor device 1000 may control the training operation of data based on a read signal (RD) and a control signal (LFDD) during the read mode. Upon completion of the training operation, the semiconductor device 1000 may output the read data to the controller 100 based on a read training signal (RDTR). In this case, the read mode may be an operation mode in which the controller 100 writes data in the semiconductor device 1000 and data read from the semiconductor device 1000 is then output to the controller 100.

The semiconductor device 1000 may control the training operation of data based on a write signal (WT) and a write training signal (WRTR) during the write mode. Upon completion of the training operation, the semiconductor device 1000 may output the read data to the controller 100 based on the read training signal (RDTR). Here, the write mode may be an operation mode in which data received from the controller 100 is written in the semiconductor device 1000.

During the write mode, the latch circuit 200 may latch data upon receiving the input signals PIN<0:N> from the training controller 300. During the read mode, the latch circuit 200 may output the latched data to the controller 100 based on the output signals POUT<0:N>. Here, the latch circuit 200 may include a plurality of pipe latches. During a normal operation after completion of the data training operation, the read or write operation is carried out in the core region 400 based on output data (DATA_OUT).

The core region 400 may denote a region in which a bank including a plurality of cell arrays is arranged. The core region 400 may include a unit cell for data input and output (input/output) (I/O) and data transmission, a bit line, a sense-amplifier (sense-amp), etc.

In addition, the training controller 300 may control the setup time and the hold time of each input data corresponding to an internal clock to be located within an appropriate range. The training controller 300 may control the training operation of data based on the control signal (LDFF), the write training signal (WRTR), or the write signal (WT), and may output the input signals PIN<0:N> and the output signals POUT<1:N> to the latch circuit 200. The training controller 300 may control the training operation of data based on the read training signal (RDTR) and the read signal (RD), and may output data (DQ) to the controller 100. The training controller 300 may control the training reset state based on the control signal (LDFF), the write training signal (WRTR), and the command signal (CMD).

Figure 2:
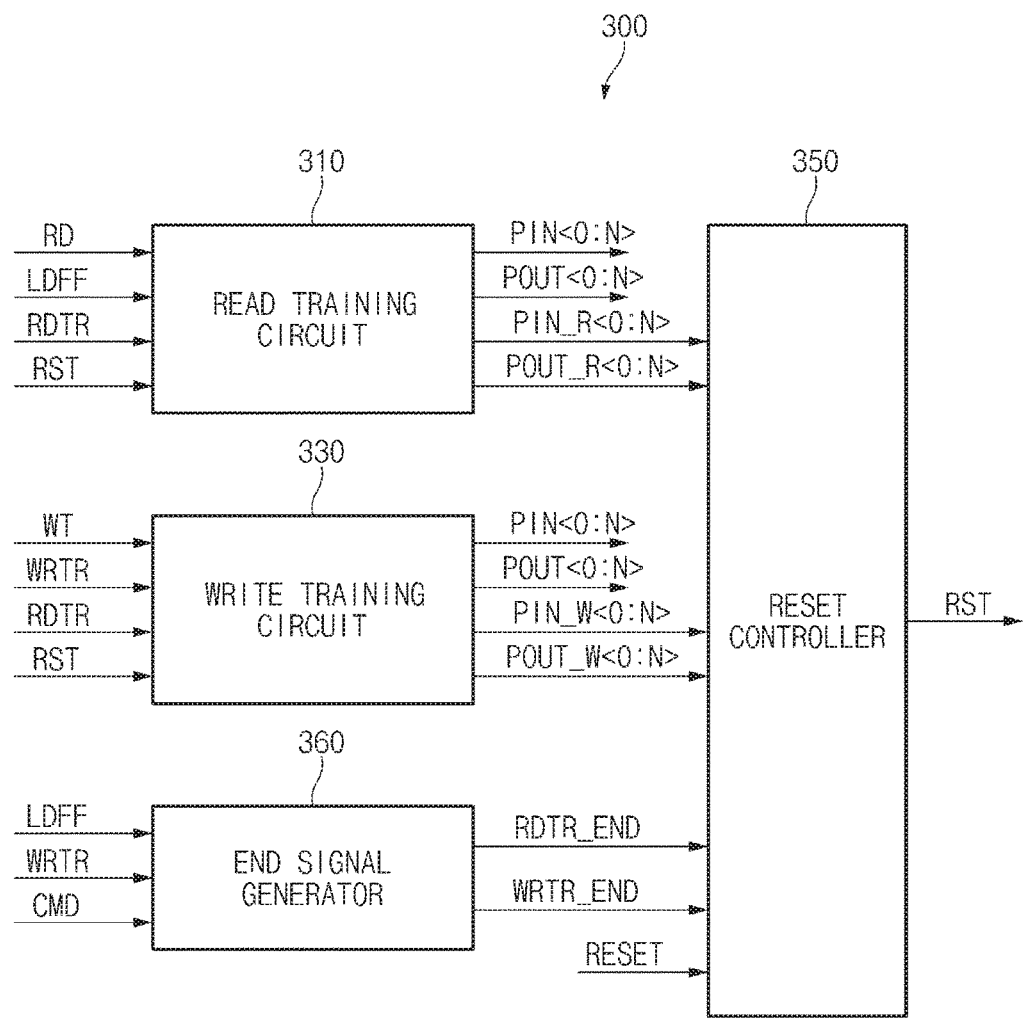
FIG. 2 is a block diagram illustrating a representation of an example of a training controller illustrated in FIG. 1 according to an embodiment of the present disclosure.

FIG. 2 is a block diagram illustrating a representation of an example of the training controller 300 illustrated in FIG. 1 according to an embodiment of the present disclosure.

Referring to FIG. 2, the training controller 300 may include a read training circuit 310, a write training circuit 330, a reset controller 350, and an end signal generator 360.

The read training circuit 310 may control the read training operation based on the read signal (RD) and the control signal (LDFF), and may output the input signals PIN<0:N> and PIN_R<0:N>. The read training circuit 310 may output the output signals POUT<0:N> and POUT_R<0:N> based on the read signal (RD) and the read training signal (RDTR). The read training circuit 310 may be reset by a reset signal (RST). The read training operation may control data transferred from the semiconductor device 1000 to the controller 100 to have appropriate setup and hold (setup/hold) times by synchronizing with an internal clock signal.

In this case, for example, the control signal (LDFF) may have a half cycle of a data input cycle. That is, the control signal (LDFF) may be used to search for the setup/hold times synchronized with the internal clock by slowly applying the write command according to the specification.

For example, assuming that data (DQ) has two pulse cycles within the same time period, the control signal (LDFF) may have a single pulse cycle. That is, assuming that data (DQ) has a double data rate (DDR), the control signal (LDFF) may have a single data rate (SDR; Single Data Rate).

Upon receiving the write signal (WT) and the write training signal (WRTR), the write training circuit 330 may control the write training operation, and may output the input signals PIN<0:N> and PIN_W<0:N>. The write training circuit 330 may output the output signals POUT<0:N> and POUT_W<0:N> based on the write signal (WT) and the read training signal (RDTR). The write training circuit 330 may be reset by the reset signal (RST). The write training operation may control data transferred from the controller 100 to the semiconductor device 1000 to have appropriate setup/hold times by synchronizing with the internal clock signal.

The reset controller 350 may compare the input signals PIN<0:N> and PIN_R<0:N> with the output signals POUT<0:N> and POUT_R<0:N>, or may compare the input signals PIN<0:N> and PIN_W<0:N> with the output signals POUT<0:N> and POUT_W<0:N>, and may generate a reset signal (RST) for resetting the training operation. The reset controller 350 may output the reset signal (RST) at an activation time of the read end signal (RDTR_END) or the write end signal (WRTR_END). The reset controller 350 may be reset by an external initialization signal (RESET).

The end signal generator 360 may generate the read end signal (RDTR_END) based on the control signal (LDFF) and the write training signal (WRTR). The end signal generator 360 may generate the write end signal (WRTR_END) based on the command signal (CMD) and the write training signal (WRTR).

In an embodiment, during the read training operation, the read training circuit 310 according to an embodiment may output the input signals PIN<0:N> and the output signals POUT<0:N> based on the read signal (RD) and the control signal (LDFF), and may perform training of I/O data of the latch circuit 200. During the write training operation, the write training circuit 330 may output the input signals PIN<0:N> and the output signals POUT<0:N> to the latch circuit 200 based on the write signal (WT) and the write training signal (WRTR), and may thus perform training of I/O data of the latch circuit 200. If the read end signal (RDTR_END) or the write end signal (WRTR_END) is activated, the reset controller 350 may selectively activate the reset signal (RST) based on the read training circuit 310 or the write training circuit 330, and may perform training of out-of-phase data (i.e., phase-twisted data).

Figure 3:
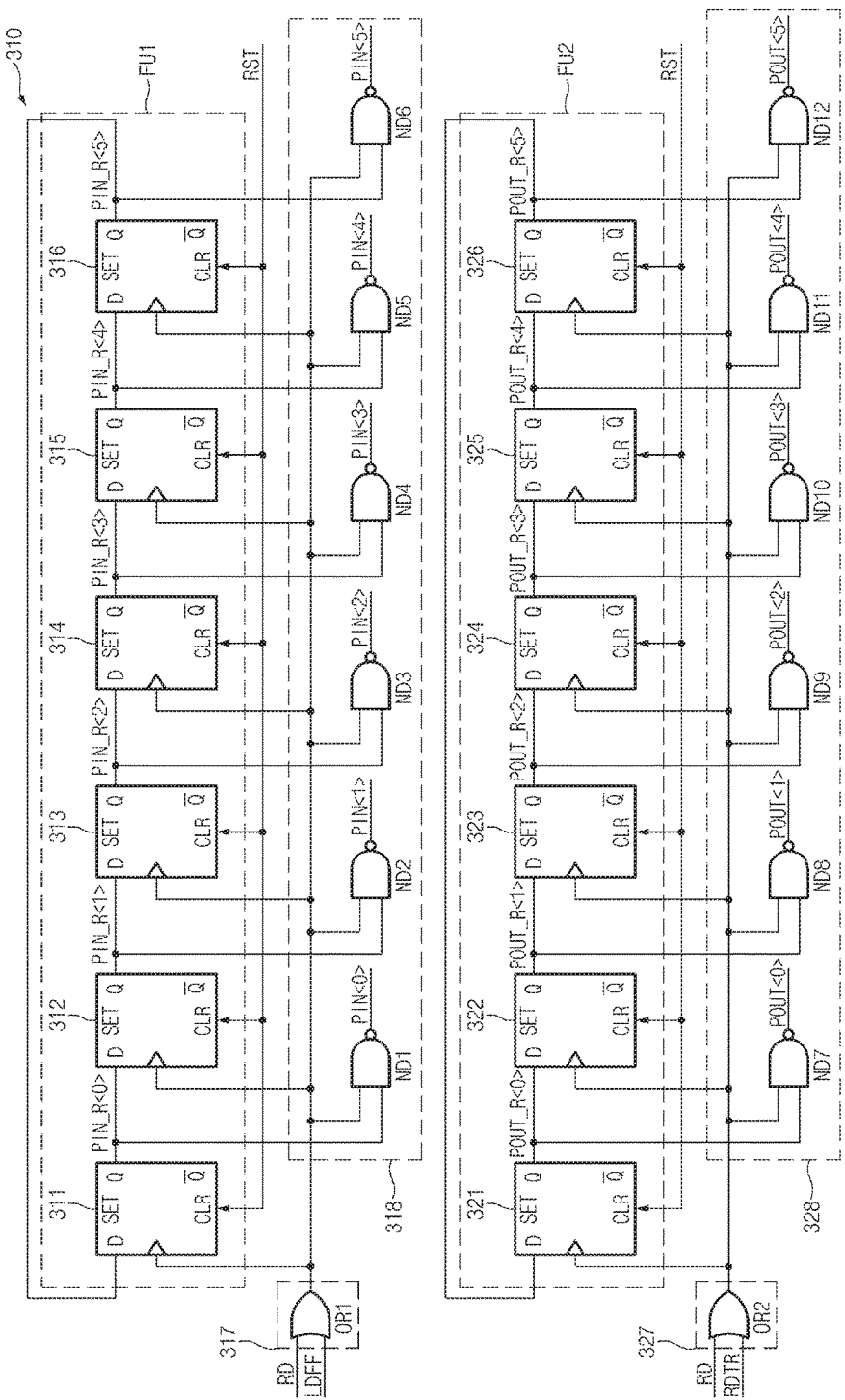
FIG. 3 is a circuit diagram illustrating a representation of an example of a read training circuit illustrated in FIG. 2.

FIG. 3 is a circuit diagram illustrating a representation of an example of the read training circuit 310 illustrated in FIG. 2.

Referring to FIG. 3, the read training circuit 310 may include flip-flop circuits FU1 and FU2, input circuits 317 and 327, and output circuits 318 and 328.

The flip-flop circuit FU1 may flip-flop input data based on an output signal of the input circuit 317, and may sequentially output a plurality of input signals PIN_R<0:N>. The flip-flop circuit FU1 may include a plurality of flip-flops 311 to 316.

Each flip-flop 311, 312, 313, 314, 315 or 316 may receive an output signal of a previous stage through an input terminal (D) thereof, and may output the input signals PIN_R<0:N> through an output terminal (Q) thereof. An input signal PIN_R<N> generated from the flip-flop 316 of the last stage is fed back to the flip-flop 311 of the first stage through the input terminal (D).

Each flip-flop 311, 312, 313, 314, 315 or 316 may operate by synchronizing with the output signal of the input circuit 317. Each flip-flop 311, 312, 313, 314, 315 or 316 may be reset by the reset signal (RST) received through a reset terminal (CLR).

The input circuit 317 may perform a logical operation between the read signal (RD) and the control signal (LDFF). If at least one of the read signal (RD) and the control signal (LDFF) is activated, the input circuit 317 may activate the output signal. The input circuit 317 may include, for example but not limited to, an OR gate (OR1) for performing a logic OR operation between the read signal (RD) and the control signal (LDFF).

The output circuit 318 may perform a logic operation between the output signal of the input circuit 317 and each of the input signals PIN_R<0:N>, and may sequentially output a plurality of input signals PIN<0:N>. The output circuit 318 may include, for example but not limited to, a plurality of NAND gates ND1 to ND6 for performing a logic NAND operation between the output signal of the input circuit 317 and the respective input signals PIN_R<0:N>.

The flip-flop circuit FU2 may flip-flop the input signal based on an output signal of the input circuit 327, and may sequentially output a plurality of output signals POUT_R<0:N>. The flip-flop circuit FU2 may include a plurality of flip-flops 321 to 326.

Each flip-flop 321, 322, 323, 324, 325 or 326 may receive an output signal of a previous stage through an input terminal (D) thereof, and may output the output signals POUT_R<0:N> through an output terminal (Q) thereof. An output strobe signal POUT_R<N> (i.e., for this example, POUT_R<5>) generated by the flip-flop 326 of the last stage is fed back to the flip-flop 321 of the first stage through the input terminal (D).

Each flip-flop 321, 322, 323, 324, 325 or 326 may operate by synchronizing with the output signal of the input circuit 327. Each flip-flop 321, 322, 323, 324, 325 or 326 may be reset by the reset signal (RST) received through a reset terminal (CLR).

The input circuit 327 may perform a logical operation between the read signal (RD) and the read training signal (RDTR). If at least one of the read signal (RD) and the read training signal (RDTR) is activated, the input circuit 327 may activate the output signal. The input circuit 327 may include, for example but not limited to, an OR gate (OR2) for performing a logic OR operation between the read signal (RD) and the read training signal (RDTR).

The output circuit 328 may perform a logic operation between the output signal of the input circuit 327 and each of the output signals POUT_R<0:N>, and may sequentially output a plurality of output signals POUT<0:N> (i.e., N may be a natural number). The output circuit 328 may include, for example but not limited to, a plurality of NAND gates ND7 to ND12 for performing a logic NAND operation between the output signal of the input circuit 327 and the respective output signals POUT_R<0:N>.

Although the embodiments of FIG. 3 have disclosed 6 input signals PIN<0:N> and 6 input signals PIN_R<0:N> for convenience of description, the scope or spirit of the present disclosure is not limited thereto, and the number of input pieces of data and the number of input signals are not limited thereto. Although the embodiments of FIG. 3 have disclosed 6 output signals POUT<0:N> and 6 output signals POUT_R<0:N> for convenience of description, the scope or spirit of the present disclosure is not limited thereto, and the number of output pieces of data and the number of output signals are not limited thereto.

Figure 4:
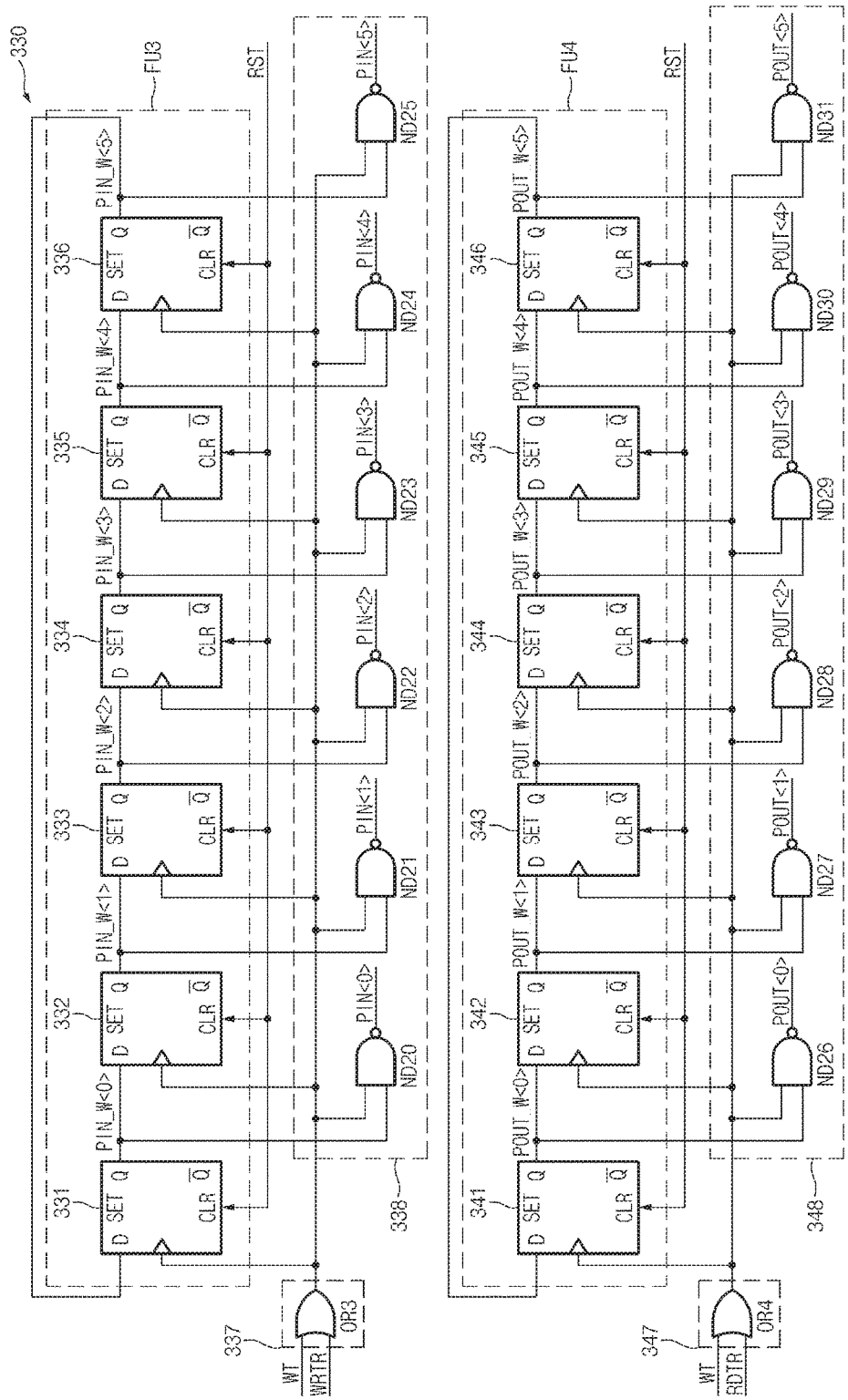
FIG. 4 is a circuit diagram illustrating a representation of an example of a write training circuit illustrated in FIG. 2.

FIG. 4 is a circuit diagram illustrating a representation of an example of the write training circuit 330 illustrated in FIG. 2.

Referring to FIG. 4, the write training circuit 330 may include flip-flop circuits FU3 and FU4, input circuits 337 and 347, and output circuits 338 and 348.

The flip-flop circuit FU3 may flip-flop input data based on an output signal of the input circuit 337, and may sequentially output a plurality of input signals PIN_W<0:N>. The flip-flop circuit FU3 may include a plurality of flip-flops 331 to 336.

Each flip-flop 331, 332, 333, 334, 335 or 336 may receive an output signal of a previous stage through an input terminal (D) thereof, and may output the input signals PIN_W<0:N> through an output terminal (Q) thereof. An input signal PIN_W<N> generated from the flip-flop 336 of the last stage is fed back to the flip-flop 331 of the first stage through the input terminal (D).

Each flip-flop 331, 332, 333, 334, 335 or 336 may operate by synchronizing with the output signal of the input circuit 337. Each flip-flop 331, 332, 333, 334, 335 or 336 may be reset by the reset signal (RST) received through a reset terminal (CLR).

The input circuit 337 may perform a logical operation between the write signal (WT) and the write training signal (WRTR). If at least one of the write signal (WT) and the write training signal (WRTR) is activated, the input circuit 337 may activate the output signal. The input circuit 337 may include, for example but not limited to, an OR gate (OR3) for performing a logic OR operation between the write signal (WT) and the write training signal (WRTR).

The output circuit 338 may perform a logic operation between the output signal of the input circuit 337 and each of the input signals PIN_W<0:N>, and may sequentially output a plurality of input signals PIN<0:N>. The output circuit 338 may include, for example but not limited to, a plurality of NAND gates ND20 to ND25 for performing a logic NAND operation between the output signal of the input circuit 337 and the respective input signals PIN_W<0:N>.

The flip-flop circuit FU4 may flip-flop the input signal based on an output signal of the input circuit 347, and may sequentially output a plurality of output signals POUT_W<0:N>. The flip-flop circuit FU4 may include a plurality of flip-flops 341 to 346.

Each flip-flop 341, 342, 343, 344, 345 or 346 may receive an output signal of a previous stage through an input terminal (D) thereof, and may output the output signals POUT_W<0:N> through an output terminal (Q) thereof. An output signal POUT_W<N> generated from the flip-flop 346 of the last stage (i.e., POUT_W<5>) is fed back to the flip-flop 341 of the first stage through the input terminal (D).

Each flip-flop 341, 342, 343, 344, 345 or 346 may operate by synchronizing with the output signal of the input circuit 347. Each flip-flop 341, 342, 343, 344, 345 or 346 may be reset by the reset signal (RST) received through a reset terminal (CLR).

The input circuit 347 may perform a logical operation between the write signal (WT) and the read training signal (RDTR). If at least one of the write signal (WT) and the read training signal (RDTR) is activated, the input circuit 347 may activate the output signal. The input circuit 347 may include, for example but not limited to, an OR gate (OR4) for performing a logic OR operation between the write signal (WT) and the read training signal (RDTR).

The output circuit 348 may perform a logic operation between the output signal of the input circuit 347 and each of the output signals POUT_W<0:N>, and may sequentially output a plurality of output signals POUT<0:N>. The output circuit 348 may include, for example but not limited to, a plurality of NAND gates ND26 to ND31 for performing a logic NAND operation between the output signal of the input circuit 347 and the respective output signals POUT_W<0:N>.

Although the embodiments of FIG. 4 have disclosed 6 input signals PIN<0:N> and 6 input signals PIN_W<0:N> for convenience of description, the scope or spirit of the present disclosure is not limited thereto, and the number of input data pieces and the number of input signals are not limited thereto. Although the embodiments of FIG. 4 have disclosed 6 output signals POUT<0:N> and 6 output signals POUT_W<0:N> for convenience of description, the scope or spirit of the present disclosure is not limited thereto, and the number of output data pieces and the number of output signals are not limited thereto.

Figure 5:
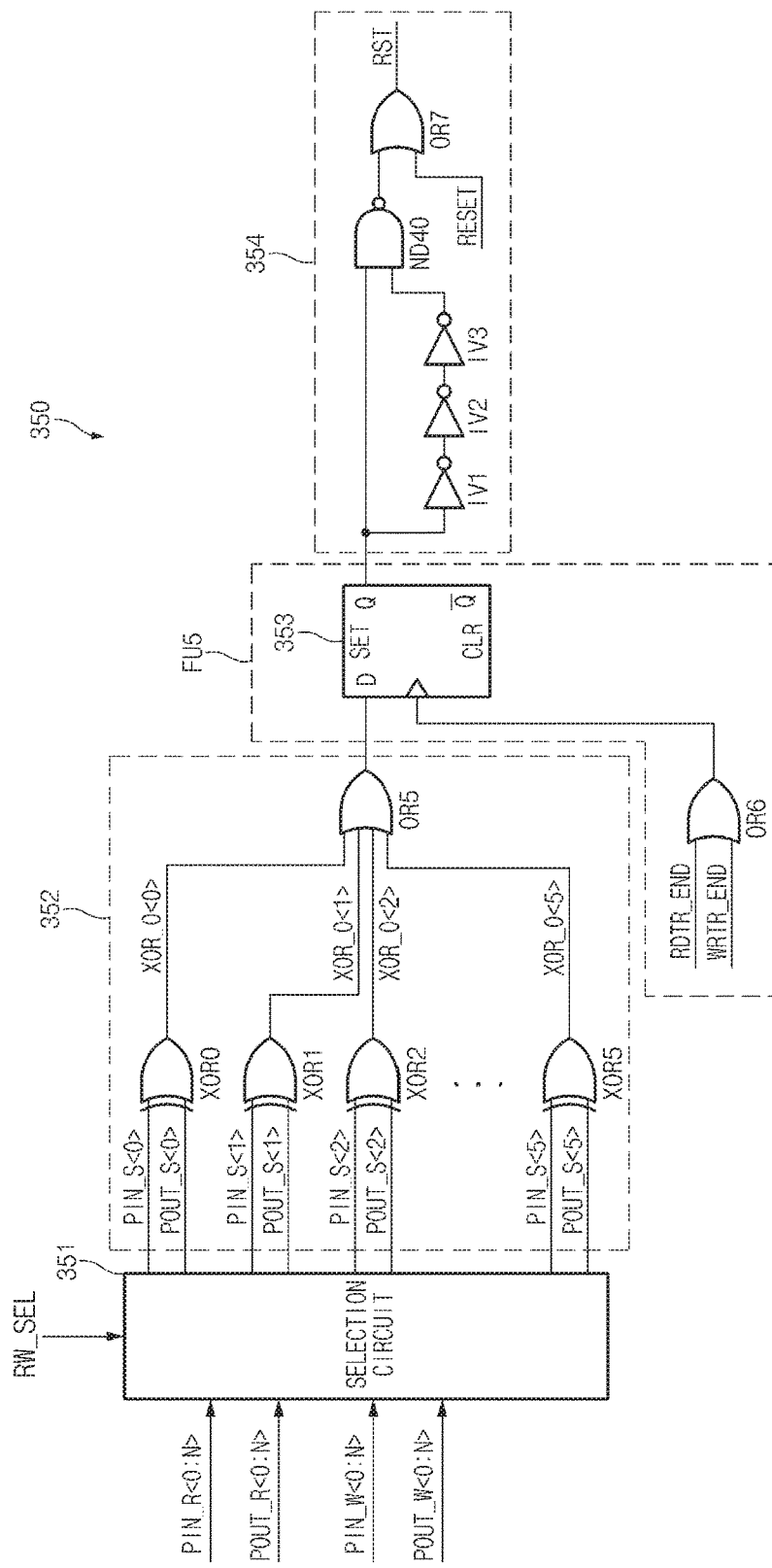
FIG. 5 is a circuit diagram illustrating a representation of a reset controller illustrated in FIG. 2.

FIG. 5 is a circuit diagram illustrating a representation of an example of the reset controller 350 illustrated in FIG. 2.

Referring to FIG. 5, the reset controller 350 may include a selection circuit 351, a logic operation circuit 352, a flip-flop circuit FU5, and a reset signal output circuit 354.

Upon receiving a selection signal (RW_SEL), the selection circuit 351 may select the input signals PIN_R<0:N> and the output signals POUT_R<0:N> received from the read training circuit 310, or may select the input signals PIN_W<0:N> and the output signals POUT_W<0:N> received from the write training circuit 330. Upon completion of the read operation, the selection signal (RW_SEL) may be generated by the read end signal (RDTR_END). Upon completion of the write operation, the selection signal (RW_SEL) may be generated by the write end signal (WRTR_END).

That is, during the read training operation, the selection circuit 351 may select the input signals PIN_R<0:N> and the output signals POUT_R<0:N>, and may thus output the input strobe signals PIN_S<0:N> and the output strobe signals POUT_S<0:N>. In contrast, during the write training operation, the selection circuit 351 may select the input signals PIN_W<0:N> and the output signals POUT_W<0:N>, and may thus output the input strobe signals PIN_S<0:N> and the output strobe signals POUT_S<0:N>.

The logic operation circuit 352 may perform a logic operation on the input strobe signals PIN_S<0:N> and the output strobe signals POUT_S<0:N>. The logic operation circuit 352 may include, for example but not limited to, a plurality of exclusive-OR (XOR) gates XOR0 to XOR5 and an OR gate OR5.

The XOR gate XOR0 may perform an XOR operation between the input strobe signal PIN_S<0> and the output strobe signal POUT_S<0>, and may thus output a logic operation signal XOR_O<0>. The XOR gate XOR1 may perform an XOR operation between the input strobe signal PIN_S<1> and the output strobe signal POUT_S<1>, and may thus output a logic operation signal XOR_O<1>. The XOR gate XOR2 may perform an XOR operation between the input strobe signal PIN_S<2> and the output strobe signal POUT_S<2>, and may thus output a logic operation signal XOR_O<2>. The XOR gate XOR5 may perform an XOR operation between the input strobe signal PIN_S<5> and the output strobe signal POUT_S<5>, and may thus output a logic operation signal XOR_O<5>.

Although the embodiments of FIG. 5 have disclosed 6 XOR gates XOR0 to XOR5 for convenience of description, the scope or spirit of the present disclosure is not limited thereto, and the number of XOR gates is not limited thereto.

The logic operation circuit 352 may also be implemented as other logics instead of the XOR gates XOR0 to XOR5.

The OR gate OR5 may perform a logic OR operation of the plurality of logic operation signals XOR_O<0:5>, and may thus output the OR operation result to the flip-flop circuit FU5. The flip-flop circuit FU5 may include a flip-flop 353 and, for example but not limited to, an OR gate OR6 for performing a logic OR operation.

The flip-flop 353 may receive an output signal of the logic operation circuit 352 through an input terminal (D) thereof, and may output the flip-flop resultant signal through an output terminal (Q) thereof. The flip-flop 353 may operate by synchronizing with an output signal of the OR gate OR6. The OR gate OR6 may perform a logic OR operation between the read end signal (RDTR_END) and the write end signal (WRTR_END).

The reset signal output circuit 354 may include a plurality of inverters IV1 to IV3, a NAND gate ND40, and an OR gate OR7. The inverters IV1 to IV3 may perform inversion delay of the output signal of the flip-flop 353. The NAND gate ND40 may perform a logic NAND operation between the output signal of the flip-flop 353 and the output signal of the inverter IV3. The OR gate OR7 may perform a logic OR operation between the output signal of the NAND gate ND40 and an initialization signal RESET, and may thus output a reset signal RST.

The reset controller 350 may compare each input strobe signal PIN_S<0:N> with each output strobe signal POUT_S<0:N>. If the input strobe signals PIN_S<0:N> are different from the output strobe signals POUT_S<0:N>, the reset controller 350 may output the reset signal (RST). When any one of the read end signal (RDTR_END) and the write end signal (WRTR_END) is activated, the reset controller 350 may output the reset signal (RST).

Figure 6:
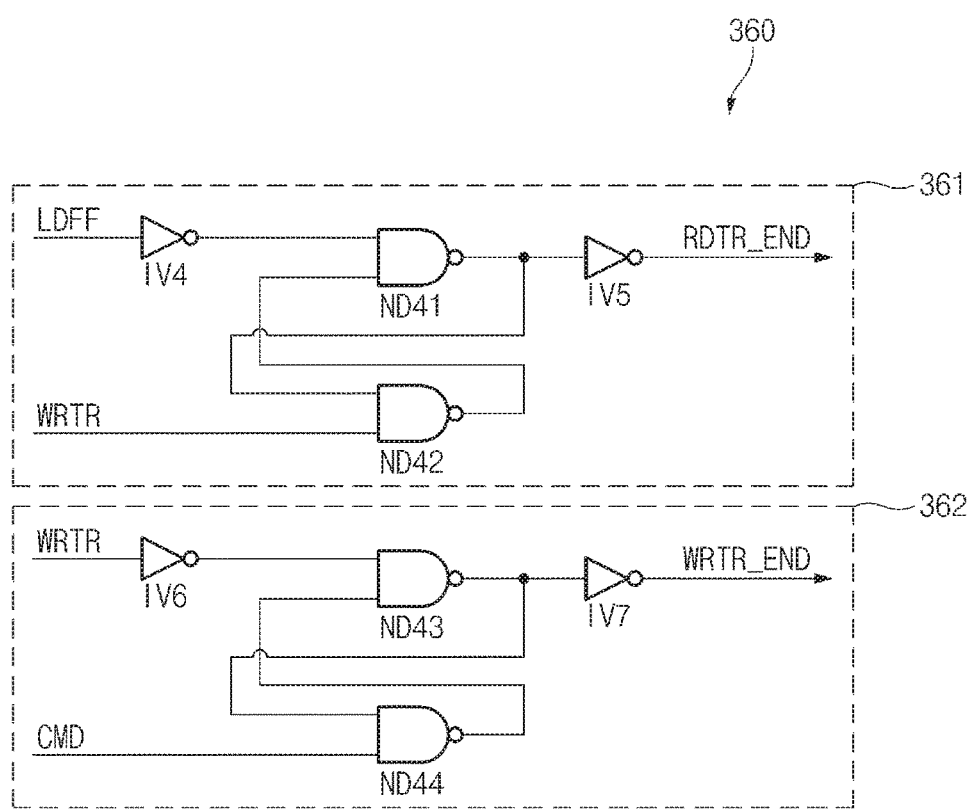
FIG. 6 is a circuit diagram illustrating a representation of an end signal generator illustrated in FIG. 2.

FIG. 6 is a circuit diagram illustrating a representation of an example of the end signal generator 360 illustrated in FIG. 2.

Referring to FIG. 6, the end signal generator 360 may include a read end signal generator 361 and a write end signal generator 362.

The read end signal generator 361 may generate a read end signal (RDTR_END) based on a control signal (LDFF) and a write training signal (WRTR). That is, if the write training signal (WRTR) is activated during the read training operation caused by the control signal (LDFF), the read end signal generator 361 may activate the read end signal (RDTR_END) indicating completion of the read operation.

The read end signal generator 361 may include a plurality of inverters IV4 and IV5 and a plurality of NAND gates ND41 and ND42. The NAND gate ND41 may perform a logic NAND operation between an output signal of the NAND gate ND42 and a control signal LDFF inverted by the inverter IV4. The NAND gate ND42 may perform a logic NAND operation between the output signal of the NAND gate ND41 and the write training signal (WRTR). The inverter IV5 may output the read end signal (RDTR_END) by inverting the output signal of the NAND gate (ND41).

The write end signal generator 362 may generate a write end signal (WRTR_END) based on a write training signal (WRTR) and a command signal (CMD). That is, if the command signal (CMD) is activated during the write training operation caused by the write training signal (WRTR), the write end signal generator 362 may activate the write end signal (WRTR_END) indicating completion of the write operation.

The write end signal generator 362 may include a plurality of inverters IV6 and IV7 and a plurality of NAND gates ND43 and ND44. The NAND gate ND43 may perform a logic NAND operation between the output signal of the NAND gate ND44 and the write training signal (WRTR) inverted by the inverter IV6. The NAND gate ND44 may perform a logic NAND operation between the command signal (CMD) and the output signal of the NAND gate ND43. The inverter IV7 may output the write end signal (WRTR_END) by inverting the output signal of the NAND gate ND43.

Figure 7:
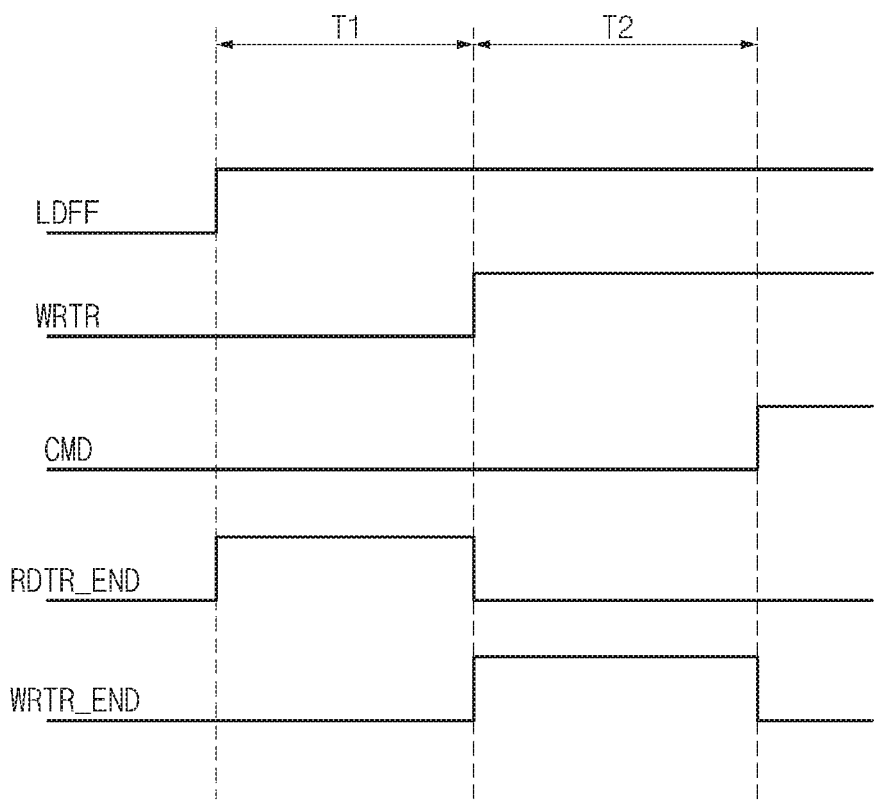
FIG. 7 is a timing diagram illustrating a representation of an example of the operation of an end signal generator illustrated in FIG. 6.

FIG. 7 is a timing diagram illustrating a representation of an example of the operation of the end signal generator 360 illustrated in FIG. 6. Further, the logic levels of the signals may be different from or the opposite of those described. For example, a signal described as having a logic "high" level may alternatively have a logic "low" level, and a signal described as having a logic "low" level may alternatively have a logic "high" level.

Referring to FIG. 7, when the end signal generator 360 enters a read training period T1, the control signal (LDFF) is activated to a logic high level. In the read training period T1, the read end signal (RDTR_END) is set to a logic high level and remains deactivated. The read end signal (RDTR_END) may be activated to a logic low level at the end time point of the read training period T1.

Thereafter, when the end signal generator 360 enters a write training period T2, the write training signal (WRTR) is activated to a logic high level. If the read end signal (RDTR_END) transitions to a logic low level during the write training period T2, the read training operation is ended and the write training operation is carried out. In the write training period T2, the write end signal (WRTR_END) is set to a logic high level and remains deactivated. The write end signal (WRTR_END) may be activated to a logic low level at the end time point of the write training period T2.

Subsequently, if the command signal (CMD) is activated to a logic high level during the normal operation, the write end signal (WRTR_END) is activated to a logic low level so that the write training period T2 is ended. The command signal (CMD) may denote an active signal, a normal read signal, a normal write signal, etc.

Figure 8:
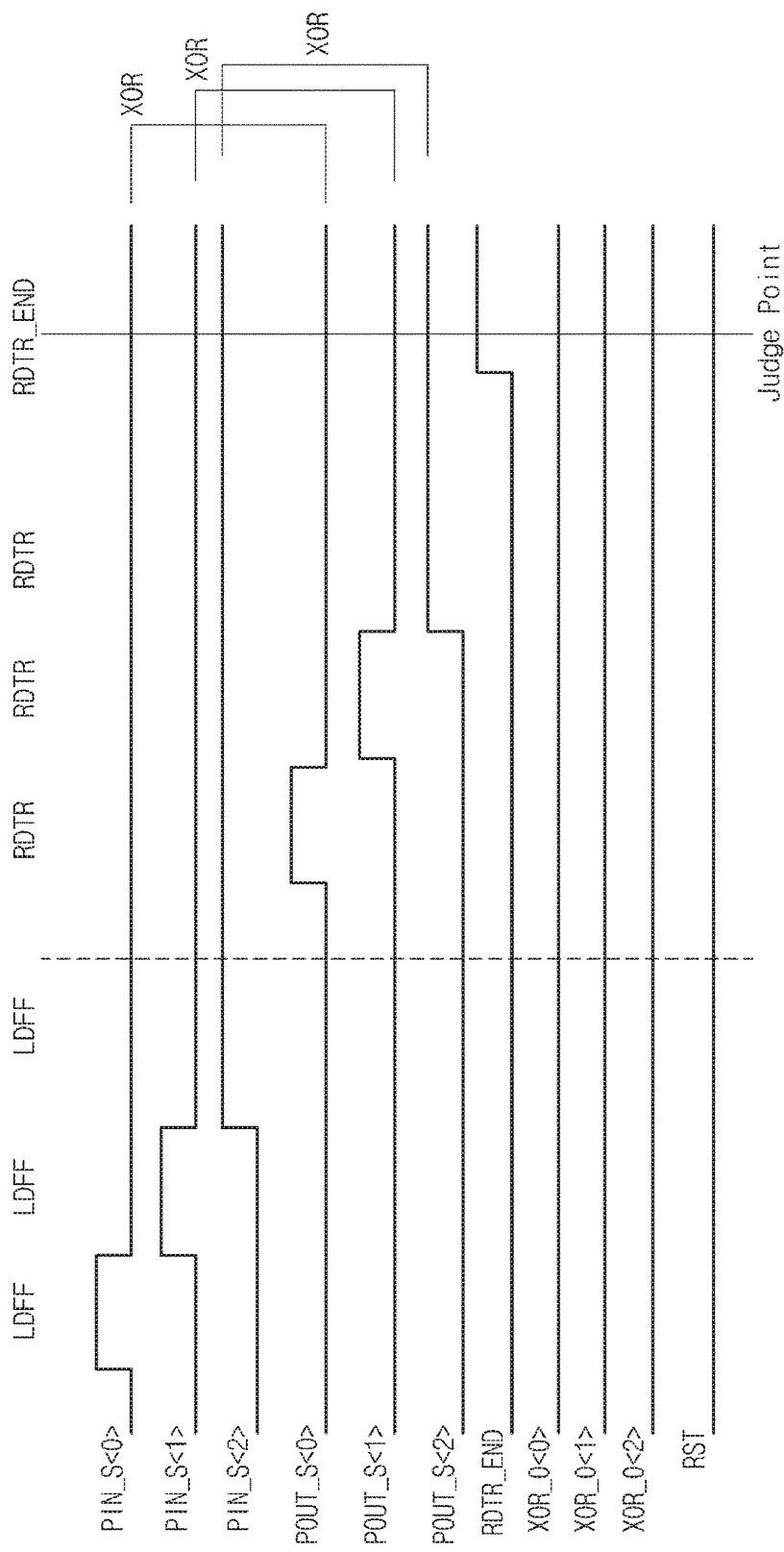
FIGS. 8 and 9 are timing diagrams illustrating representations of examples of the operation of a semiconductor device according to an embodiment of the present disclosure.
Figure 9:
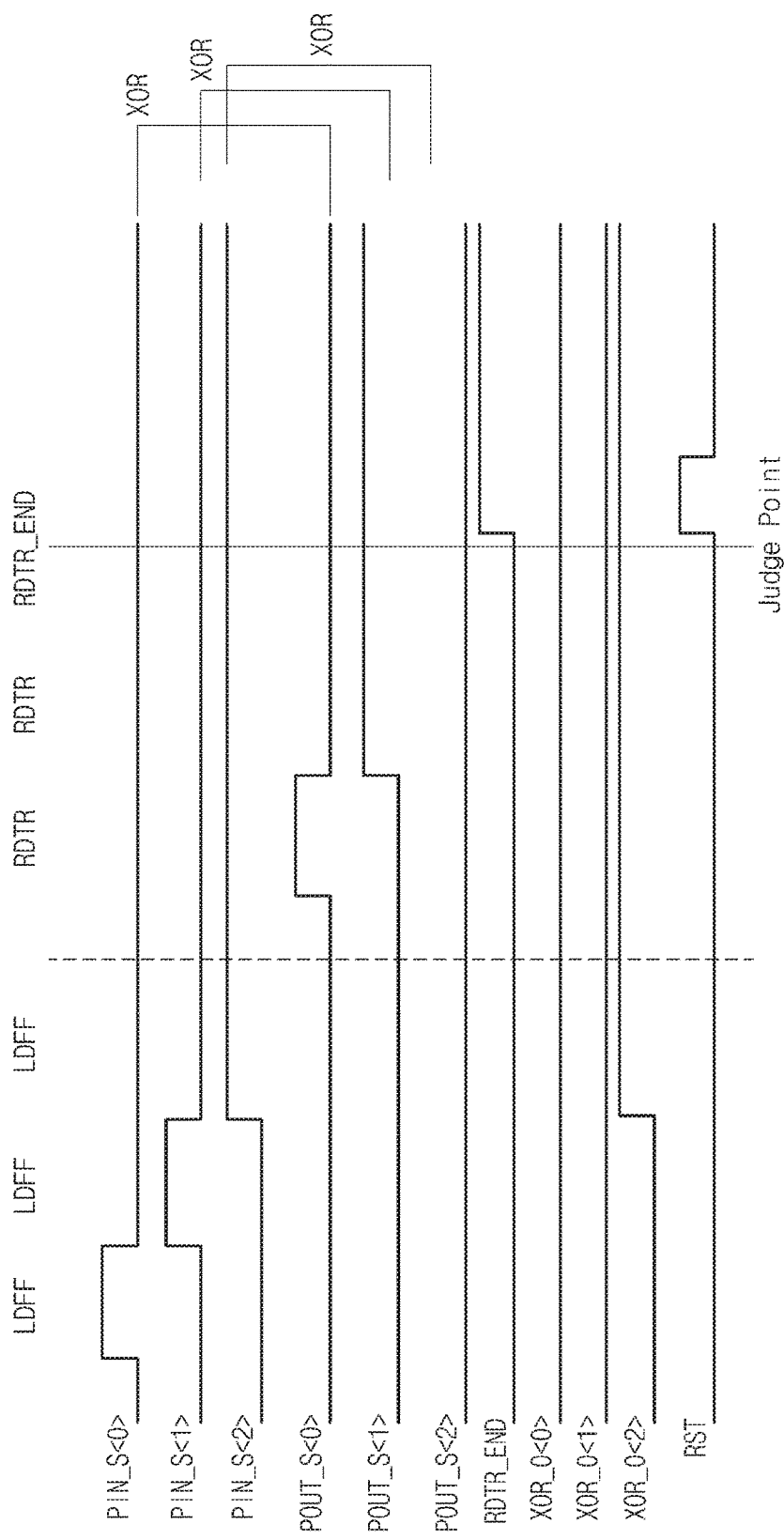

FIGS. 8 and 9 are timing diagrams illustrating representations of examples of the operation of a semiconductor device according to an embodiment of the present disclosure. Further, the logic levels of the signals may be different from or the opposite of those described. For example, a signal described as having a logic "high" level may alternatively have a logic "low" level, and a signal described as having a logic "low" level may alternatively have a logic "high" level.

FIG. 8 illustrates an example of a case in which the reset signal (RST) is not generated during the normal operation.

For example, as illustrated in FIG. 8, the control signal (LDFF) is input three times, and the read training signal (RDTR) is input three times, so that the number of write commands is identical to the number of read commands.

The reset controller 350 may compare each input strobe signal PIN_S<0:N> with each output strobe signal POUT_S<0:N>. If the logic level of the input strobe signal PIN_S<0:N> is different from the logic level of the output strobe signal POUT_S<0:N>, the reset controller 350 may output the reset signal (RST) having a logic low level at the activation time of the read end signal (RDTR_END).

For example, it is assumed that the input strobe signals PIN_S<0:2> are set to a logic high level so that the logic-high-level input strobe signals PIN_S<0:2> are input to the XOR gates (XOR<0:2>, and it is also assumed that the output strobe signals POUT_S<0:2> are set to a logic high level so that logic-high-level output strobe signals POUT_S<0:2> are input to the XOR gates XOR<0:2>. The XOR gates XOR<0:2> may compare each high-level input strobe signal PIN_S<0:2> with each high-level output strobe signal POUT_S<0:2>. In other words, if the two input strobe signals have the same logic level, the XOR gates XOR<0:2> may output low-level logic operation signals XOR_O<0:2>. If the two input strobe signals have different logic levels, the XOR gates XOR<0:2> may output low-high logic operation signals XOR_O<0:2>.

Since each input strobe signal PIN_S<0:2> and each output strobe signal POUT_S<0:2> have the same logic level as illustrated in the embodiment of FIG. 8, the reset signal (RST) may be output as a logic low level signal. The logic level of the reset signal (RST) is determined at a judgment time point (i.e., judge point) at which the read end signal (RDTR_END) is activated to a logic high level. In this case, if the reset signal (RST) is at a logic low level at the judgment time point, this means that a phase of input data is matched to a phase of output data so that a normal training operation is carried out.

In this case, each of the judgment time point at which the logic level of the reset signal (RST) is determined and the activation time point of the read end signal (RDTR_END) may have a predetermined delay time. That is, after lapse of a predetermined delay time upon activation of the read end signal (RDTR_END), the logic level of the reset signal RST may be determined.

FIG. 9 illustrates an example in which the reset signal (RST) is activated during an abnormal operation. For example, as illustrated FIG. 9, the control signal (LDFF) is input three times, and the read training signal (RDTR) is input two times, so that the number of write commands is mismatched to the number of read commands.

The reset controller 350 may compare each input strobe signal PIN_S<0:N> with each output strobe signal POUT_S<0:N>. If the logic level of the input strobe signal PIN_S<0:N> is different from the logic level of the output strobe signal POUT_S<0:N>, the reset controller 350 may output the reset signal (RST) having a logic high level at the activation time of the read end signal (RDTR_END).

If the input strobe signals PIN_S<0:2> denoted by "111" and the output strobe signals POUT_S<1:N> denoted by "110" are input, the logic level of the input strobe signals PIN_S<0:2> denoted by "111" may not match the logic level of the output strobe signals POUT_S<0:N> denoted by "110". The reset signal (RST) may be output as a logic high level signal by synchronizing with a specific time at which the read end signal (RDTR_END) is activated to a logic high level. The flip-flop circuits (FU1, FU2) or (FU3, FU4) may be reset.

For example, it is assumed that the input strobe signals PIN_S<0:2> are set to a logic high level so that the high-level input strobe signals PIN_S<0:2> are input to the XOR gates XOR<0:2>. It is also assumed that the output strobe signals POUT_S<0:2> are sequentially classified into a high-level output strobe signal, a high-level output strobe signal, and a low-level output strobe signal, so that the high-level output strobe signal, the high-level output strobe signal, and the low-level output strobe signal are respectively input to the XOR gates XOR<0:2>. The XOR gates XOR<0:2> may compare each input strobe signal PIN_S<0:2> with each output strobe signal POUT_S<0:2>. Since two input signals of the XOR gates XOR<0:1> have the same logic level, the logic operation signals XOR_O<0:1> may be output as logic low level signals. However, since two input signals have different logic levels, the XOR gate XOR<2> may output the logic operation signal XOR_O<2> as a logic high level signal.

Since the input strobe signal PIN_S<2> and the output strobe signal POUT_S<2> have different logic levels as illustrated in an embodiment of FIG. 9, the reset signal (RST) may be output as a logic high level signal. The logic level of the reset signal (RST) is determined at a judgment time point (i.e., Judge Point) at which the read end signal (RDTR_END) is activated to a logic high level. In this case, if the reset signal (RST) is at a logic high level, this means that a phase of input data and a phase of output data are out of phase with each other, so that the training operation is reset.

In this case, each of the judgment time point at which the logic level of the reset signal (RST) is determined and the activation time point of the read end signal (RDTR_END) may have a predetermined delay time. That is, after lapse of a predetermined delay time after the judgment time point at which the logic level of the reset signal (RST) is determined, the reset signal (RST) may be activated by synchronizing with an activation time point of the read end signal (RDTR_END).

As is apparent from the above description, the semiconductor device according to the embodiments of the present disclosure generates a reset signal when mismatch occurs in a read training operation and a write training operation, resulting in prevention of a training error.

Figure 10:
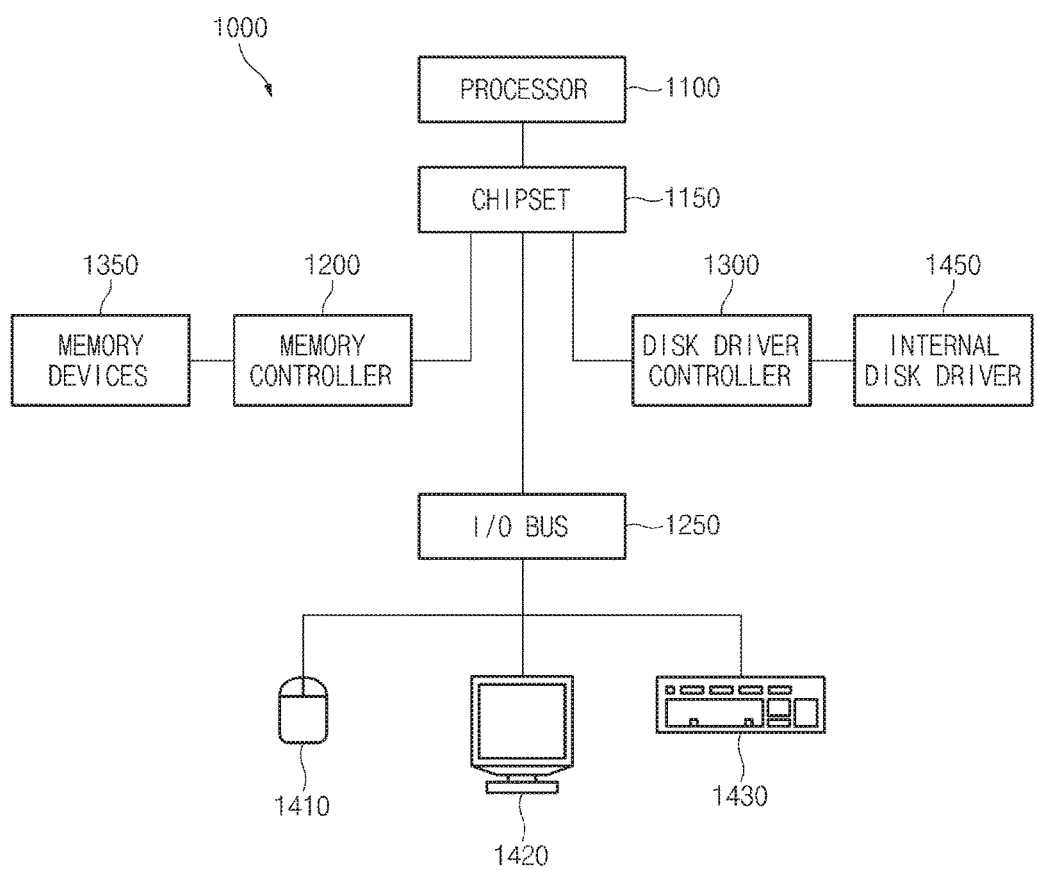
FIG. 10 illustrates a block diagram of an example of a representation of a general system employing a training controller, semiconductor device, and or system in accordance with the various embodiments discussed above with relation to FIGS. 1-9.

The training controller, semiconductor device, and or system as discussed above (see FIGS. 1-9) are particular useful in the design of other memory devices, processors, and computer systems. For example, referring to FIG. 10, a block diagram of a general system employing a training controller, semiconductor device, and or system in accordance with the various embodiments are illustrated and generally designated by a reference numeral 1000. The general system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a general system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the general system 1000. Other components of the general 1000 may include a memory controller 1200, an input/output ("I/O") bus 1250, and a disk driver controller 1300. Depending on the configuration of the general system 1000, any one of a number of different signals may be transmitted through the chipset 1150, and those skilled in the art will appreciate that the routing of the signals throughout the general system 1000 can be readily adjusted without changing the underlying nature of the general system 1000.

As stated above, the memory controller 1200 may be operably coupled to the chipset 1150. The memory controller 1200 may include at least one training controller, semiconductor device, and or system as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one training controller, semiconductor device, and or system as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the general system 1000 described above in relation to FIG. 10 is merely one example of a training controller, semiconductor device, and or system as discussed above with relation to FIGS. 1-9. In alternate embodiments, such as, for example but not limited to, cellular phones or digital cameras, the components may differ from the embodiments illustrated in FIG. 10.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
a read training circuit configured to generate a plurality of first input signals based on a read signal and a control signal, and output a plurality of first output signals based on the read signal and a read training signal;
a write training circuit configured to generate a plurality of second input signals based on a write signal and a write training signal, and output a plurality of second output signals based on the write signal and the read training signal; and
a reset controller configured to select the plurality of first input signals and the plurality of first output signals or the plurality of second input signals and the plurality of second output signals based on a selection signal to generate a plurality of input strobe signals and a plurality of output strobe signals, and compare the plurality of input strobe signals with the plurality of output strobe signals to output a reset signal,
wherein the write training circuit and the read training circuit are reset by the reset signal.

2. The semiconductor device according to claim 1, wherein the control signal has a time period lagging a data input period.

3. The semiconductor device according to claim 1, further comprising:
an end signal generator configured to output a read end signal based on the control signal and the write training signal, and output a write end signal based on a command signal and the write training signal,
wherein the reset controller is configured to output the reset signal at an activation time of the read end signal, or output the reset signal at an activation time of the write end signal.

4. The semiconductor device according to claim 3, wherein the end signal generator includes:
a read end signal generator configured to generate the read end signal based on the control signal and the write training signal; and
a write end signal generator configured to generate the write end signal based on the write training signal and the command signal.

5. The semiconductor device according to claim 1, wherein the read training circuit includes:
a first input circuit configured to perform a logic operation between the read signal and the control signal;
a first flip-flop circuit configured to flip-flop an input signal based on an output signal of the first input circuit, and sequentially output the plurality of first input signals;
a first output circuit configured to perform a logic operation between the output signal of the first input circuit and the plurality of first input signals, and sequentially output a plurality of third input signals;
a second input circuit configured to perform a logic operation between the read signal and the read training signal;
a second flip-flop circuit configured to flip-flop an input signal based on an output signal of the second input circuit, and sequentially output the plurality of first output signals; and
a second output circuit configured to perform a logic operation between the output signal of the second input circuit and the plurality of first output signals, and sequentially output a plurality of third output signals, wherein each of the first flip-flop circuit and the second flip-flop circuit includes:
a plurality of flip-flops, each of which is reset by the reset signal.

6. The semiconductor device according to claim 5, wherein:
if any one of the read signal and the control signal is activated, the first input circuit is configured to activate an output signal thereof; and
if any one of the read signal and the read training signal is activated, the second input circuit is configured to activate an output signal thereof;
wherein:
the first output circuit includes a plurality of logic gates configured to perform a logic NAND operation between the output signal of the first input circuit and each of the plurality of first input signals; and
the second output circuit includes a plurality of logic gates configured to perform a logic NAND operation between the output signal of the second input circuit and each of the plurality of first output signals.

7. The semiconductor device according to claim 1, wherein the write training circuit includes:
a third input circuit configured to perform a logic operation between the write signal and the write training signal;
a third flip-flop circuit configured to flip-flop an input signal based on an output signal of the third input circuit, and sequentially output the plurality of second input signals;
a third output circuit configured to perform a logic operation between the output signal of the third input circuit and each of the plurality of second input signals, and sequentially output a plurality of fourth input signals;
a fourth input circuit configured to perform a logic operation between the write signal and the read training signal;
a fourth flip-flop circuit configured to flip-flop an input signal based on an output signal of the fourth input circuit, and sequentially output the plurality of second output signals; and
a fourth output circuit configured to perform a logic operation between the output signal of the fourth input circuit and each of the plurality of second output signals, and sequentially output a plurality of fourth output signals,
wherein each of the third flip-flop circuit and the fourth flip-flop circuit includes:
a plurality of flip-flops, each of which is reset by the reset signal.

8. The semiconductor device according to claim 7, wherein:
if any one of the write signal and the write training signal is activated, the third input circuit is configured to activate an output signal thereof; and
if any one of the write signal and the read training signal is activated, the fourth input circuit is configured to activate an output signal thereof.

9. The semiconductor device according to claim 7, wherein:
the third output circuit includes a plurality of logic gates configured to perform a logic NAND operation between the output signal of the third input circuit and each of the plurality of second input signals; and
the fourth output circuit includes a plurality of logic gates configured to perform a logic NAND operation between the output signal of the fourth input circuit and each of the plurality of second output signals.

10. The semiconductor device according to claim 1, wherein the reset controller includes:
a selection circuit configured to select the plurality of first input signals and the plurality of first output signals or the plurality of second input signals and the plurality of second output signals based on a selection signal, and generate a plurality of input strobe signals and a plurality of output strobe signals;
a logic operation circuit configured to perform a logic operation between each of the plurality of input strobe signals and each of the plurality of output strobe signals;
a fifth flip-flop circuit configured to flip-flop an output signal of the logic operation circuit when any one of a read end signal and a write end signal is activated, and output a flip-flop resultant signal; and
a reset signal output circuit configured to perform a logic operation between an output signal of the fifth flip-flop circuit and an initialization signal, and output the reset signal.

11. The semiconductor device according to claim 10, wherein the logic operation circuit includes:
a plurality of XOR gates configured to perform a logic XOR operation between each of the plurality of input strobe signals and each of the plurality of output strobe signals, and output a plurality of logic operation signals; and
an OR gate configured to perform a logic OR operation between the plurality of logic operation signals.

12. The semiconductor device according to claim 1, wherein:
the reset controller compares each of the plurality of input strobe signals with each of the plurality of output strobe signal signals; and
if the plurality of input strobe signals are different from the plurality of output strobe signals, the reset controller is configured to output the reset signal at an activation time of any one of a read end signal and a write end signal.

13. A system comprising:
a controller configured to generate a write signal, a read signal, a control signal, a write training signal, and a read training signal; and
a read training circuit configured to control a read training operation based on the read signal, the control signal and the read training signal;
a write training circuit configured to control a write training operation based on the write signal, the write training signal and the read training signal; and
a reset controller configured to generate a reset signal when a mismatch occurs in the read training operation or the write training operation,
wherein the write training circuit and the read training circuit are reset by the reset signal.

14. The system according to claim 13, wherein the training controller further includes:
an end signal generator configured to output a read end signal based on the control signal and a write training signal, and output a write end signal based on a command signal and the write training signal.

15. The system according to claim 14, wherein the reset controller is configured to output the reset signal at an activation time of the read end signal, or output the reset signal at an activation time of the write end signal.

16. The system according to claim 13, further comprising:

a latch circuit configured to latch output data of the training controller, and output latched output data to a core region.

17. A semiconductor device comprising:

a latch circuit configured to latch data based on input signals and output the latched data based on output signals; and a training controller configured to output the input signals and the output signals to the latch circuit based on a read signal and a control signal during a read training operation and perform training of input and output (I/O) data of the latch circuit, and configured to output the input signals and the output signals to the latch circuit based on a write signal and a write training signal during a write training operation and perform training of I/O data of the latch circuit.

18. The semiconductor device according to claim 17, wherein the training controller includes:

a read training circuit configured to control a read training operation based on the read signal, the control signal and the read training signal;

a write training circuit configured to control a write training operation based on the write signal, the write training signal and the read training signal; and a reset controller configured to generate a reset signal when a mismatch occurs in the read training operation or the write training operation.

19. The semiconductor device according to claim 18, wherein the training controller further includes:

an end signal generator configured to output a read end signal based on the control signal and a write training signal, and output a write end signal based on a command signal and the write training signal, wherein the write training circuit and the read training circuit are reset by the reset signal.

20. The semiconductor device according to claim 19, wherein the reset controller is configured to output the reset signal at an activation time of the read end signal, or output the reset signal at an activation time of the write end signal.

\* \* \* \* \*